(12) United States Patent
Tai et al.

(10) Patent No.: US 12,512,372 B2
(45) Date of Patent: Dec. 30, 2025

(54) SEMICONDUCTOR STRUCTURE WITH TESTING PADS AND METHOD OF MANUFACTURING THEREOF

(71) Applicant: TAIWAN SEMICONDUCTOR MANUFACTURING COMPANY LTD., Hsinchu (TW)

(72) Inventors: Chih-Hsuan Tai, Taipei (TW); Yu-Wei Chiu, Pingtung County (TW); Kuo Wen Chen, Hsinchu (TW); Hsiang-Tai Lu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 432 days.

(21) Appl. No.: 18/154,847

(22) Filed: Jan. 15, 2023

(65) Prior Publication Data

US 2024/0170349 A1 May 23, 2024

(51) Int. Cl.
*H01L 21/66* (2006.01)
*H01L 21/56* (2006.01)
(Continued)

(52) U.S. Cl.
CPC ............ *H01L 22/32* (2013.01); *H01L 21/565* (2013.01); *H01L 21/76898* (2013.01); *H01L 23/3128* (2013.01); *H01L 23/481* (2013.01)

(58) Field of Classification Search
CPC . H01L 21/565; H01L 23/3128; H01L 23/481; H01L 22/32; H01L 23/585; H01L 21/76898; H01L 23/562; H01L 21/56; H01L 21/486; H01L 23/528; H01L 25/0657; H01L 25/50; H01L 21/02274; H01L 23/3192; H01L 24/08; H01L 23/3171; H01L 23/53295; H01L 23/5389; H01L 25/0652; H01L 23/49816; H01L 24/97; H01L 24/96; H01L 21/561; H01L 24/19; H01L 2224/80357; H01L 2225/06586; H01L 2224/05684; H01L 2224/05655; H01L 2224/94; H01L 2225/06548; H01L 2224/05624;
(Continued)

(56) References Cited

U.S. PATENT DOCUMENTS 8,802,504 B1  8/2014  Hou et al.
8,803,292 B2  8/2014  Chen et al.
(Continued)

*Primary Examiner* — Mouloucoulaye Inoussa
(74) *Attorney, Agent, or Firm* — WPAT LAW; Anthony King

(57) ABSTRACT

A method of manufacturing a semiconductor structure, comprising: disposing a dielectric layer over a semiconductive wafer defined with a plurality of active regions and a scribe line region surrounding each of the plurality of active regions; forming a plurality of interconnect structures within the dielectric layer, wherein the formation of the plurality of interconnect structures includes forming a plurality of first testing pads within the scribe line region and at least partially exposed through the dielectric layer; and sawing the semiconductive wafer along the scribe line region to form a first interposer and a second interposer, wherein each of the plurality of first testing pads is at least partially removed by the sawing of the semiconductive wafer.

20 Claims, 17 Drawing Sheets

(51) Int. Cl.
  *H01L 21/768* (2006.01)
  *H01L 23/31* (2006.01)
  *H01L 23/48* (2006.01)

(58) Field of Classification Search
  CPC ... H01L 2225/06527; H01L 2224/9222; H01L 2224/08146; H01L 2224/96; H01L 2224/80895; H01L 2224/05666; H01L 2224/19; H01L 2224/05647; H01L 2224/95; H01L 2224/08145; H01L 2224/80896; H01L 2224/05546; H01L 2224/80001; H01L 2224/0401; H01L 2224/97; H01L 2224/13144; H01L 2924/18162
  See application file for complete search history.

(56) References Cited

U.S. PATENT DOCUMENTS

| | | | |
|---|---|---|---|
| 8,803,316 B2 | 8/2014 | Lin et al. | |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,496,189 B2 | 11/2016 | Yu et al. | |
| 10,475,762 B1* | 11/2019 | Yeh | H01L 24/20 |
| 11,199,508 B1* | 12/2021 | Wu | G01N 21/9501 |
| 2010/0072635 A1* | 3/2010 | Kuo | H01L 24/13 257/E23.179 |
| 2015/0279825 A1* | 10/2015 | Kang | H01L 25/0657 438/109 |
| 2016/0079204 A1* | 3/2016 | Matsubara | H01L 23/3128 438/114 |
| 2016/0300813 A1* | 10/2016 | Zhai | H01L 25/0652 |
| 2018/0138151 A1* | 5/2018 | Shih | H01L 25/50 |
| 2019/0067104 A1* | 2/2019 | Huang | H01L 24/16 |
| 2020/0402960 A1* | 12/2020 | Chen | H01L 23/3121 |
| 2021/0057303 A1* | 2/2021 | Chen | H01L 21/486 |
| 2021/0066222 A1* | 3/2021 | Chen | H01L 21/76879 |
| 2021/0210399 A1* | 7/2021 | Lin | H01L 23/49816 |
| 2021/0327778 A1* | 10/2021 | Yu | H01L 21/561 |
| 2021/0343547 A1* | 11/2021 | Chang | H01L 25/0655 |
| 2021/0375826 A1* | 12/2021 | Chen | H01L 23/3128 |
| 2022/0130798 A1* | 4/2022 | Hong | H01L 24/08 |
| 2022/0293546 A1* | 9/2022 | Yang | H01L 24/19 |
| 2022/0301970 A1* | 9/2022 | Kao | H01L 23/49816 |
| 2022/0302034 A1* | 9/2022 | Chen | H01L 23/585 |

\* cited by examiner

S300

Disposing a dielectric layer over a semiconductive wafer defined with a plurality of active regions and a scribe line region surrounding each of the plurality of active regions — S301

Forming a plurality of interconnect structures within the dielectric layer, wherein the formation of the plurality of interconnect structures includes forming a plurality of first testing pads within the scribe line region and at least partially exposed through the dielectric layer — S302

Sawing the semiconductive wafer along the scribe line region to form a first interposer and a second interposer — S303

FIG. 8

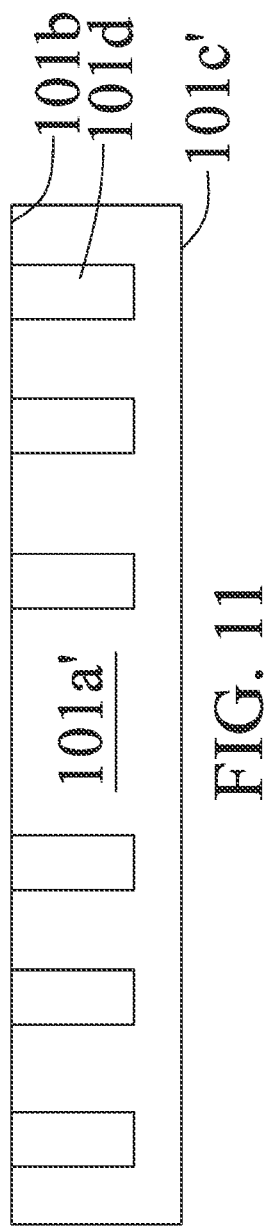
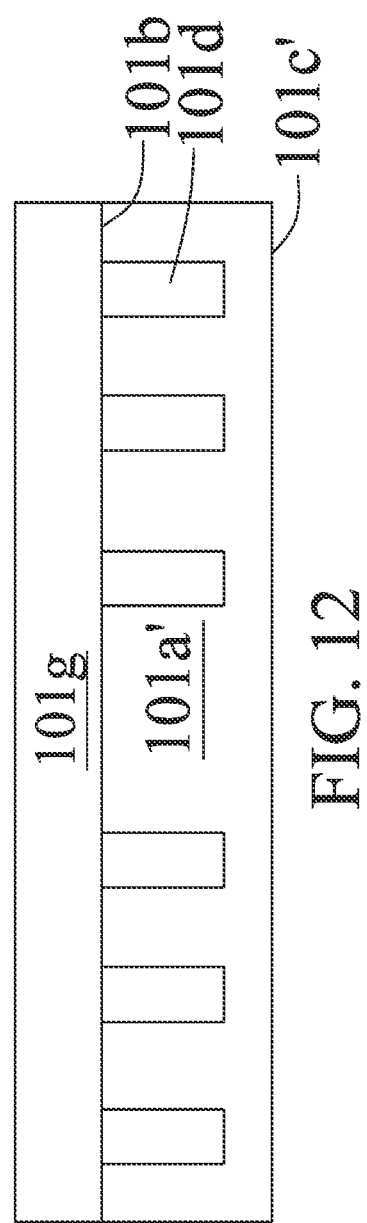

SEMICONDUCTOR STRUCTURE WITH TESTING PADS AND METHOD OF MANUFACTURING THEREOF

PRIORITY CLAIM AND CROSS-REFERENCE

This application claims the benefit of prior-filed provisional application No. 63/384,228, filed on 18 Nov. 2022.

BACKGROUND

The semiconductor industry has experienced rapid growth due to ongoing improvements in the integration density of a variety of electrical components. To accommodate the miniaturized scale of the semiconductor device, various technologies and applications have been developed for the wafer-level packaging, involving greater numbers of different components with different functions. Improvement in integration density has resulted from iterative reduction of minimum feature size, which allows more components to be integrated into a given area.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 8 is a flow diagram of a method of manufacturing a first semiconductor structure in accordance with some embodiments of the present disclosure.

FIGS. 9 to 18 are cross-sectional views of one or more stages of the method of manufacturing a semiconductor structure in accordance with some embodiments of the present disclosure.

DETAILED DESCRIPTION

Figure 1:
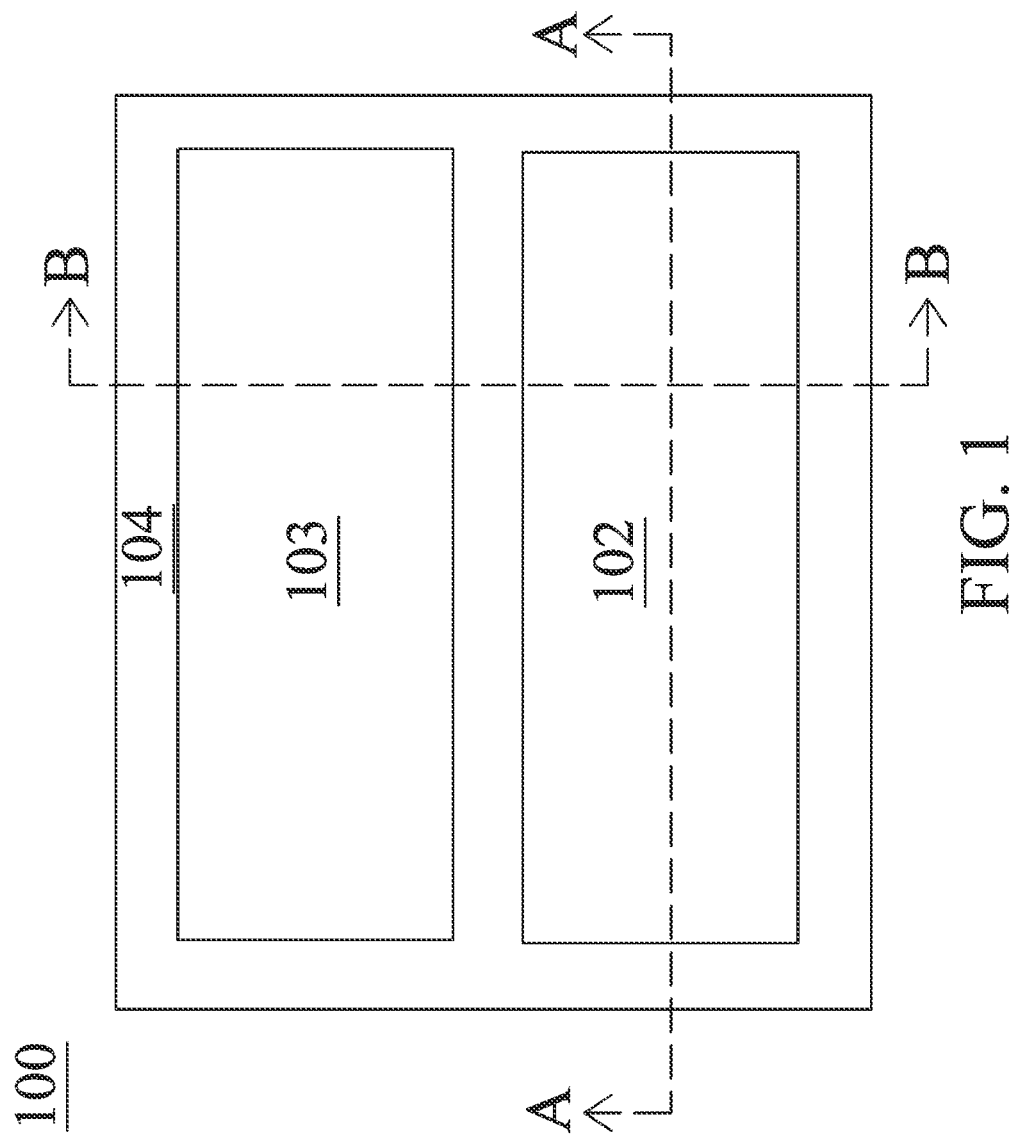
FIG. 1 is a cross-sectional top view of a first semiconductor structure in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies.

Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In the present disclosure, a semiconductor structure and a method of manufacturing a semiconductor structure are provided. The semiconductor structure includes a testing pad within an active region of an interposer. Further, the method of manufacturing the semiconductor structure includes forming a testing pad within a scribe line region, and then removing the testing pad by sawing operations. Other features and processes may also be included. As a result, testing pad would occupy lesser area. An overall size of the semiconductor structure can be further reduced.

Figure 2:
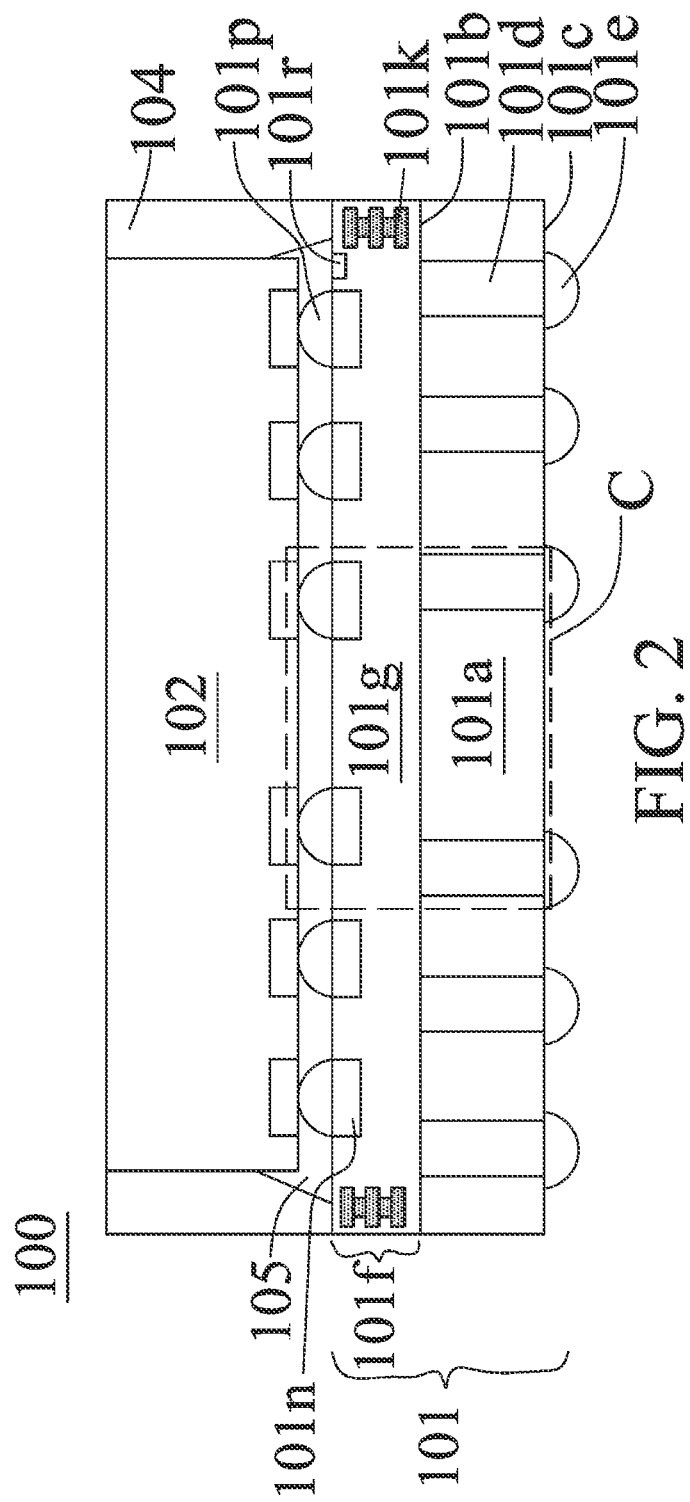
FIG. 2 is a cross-sectional view of the first semiconductor structure of FIG. 1 along a line AA.
Figure 3:
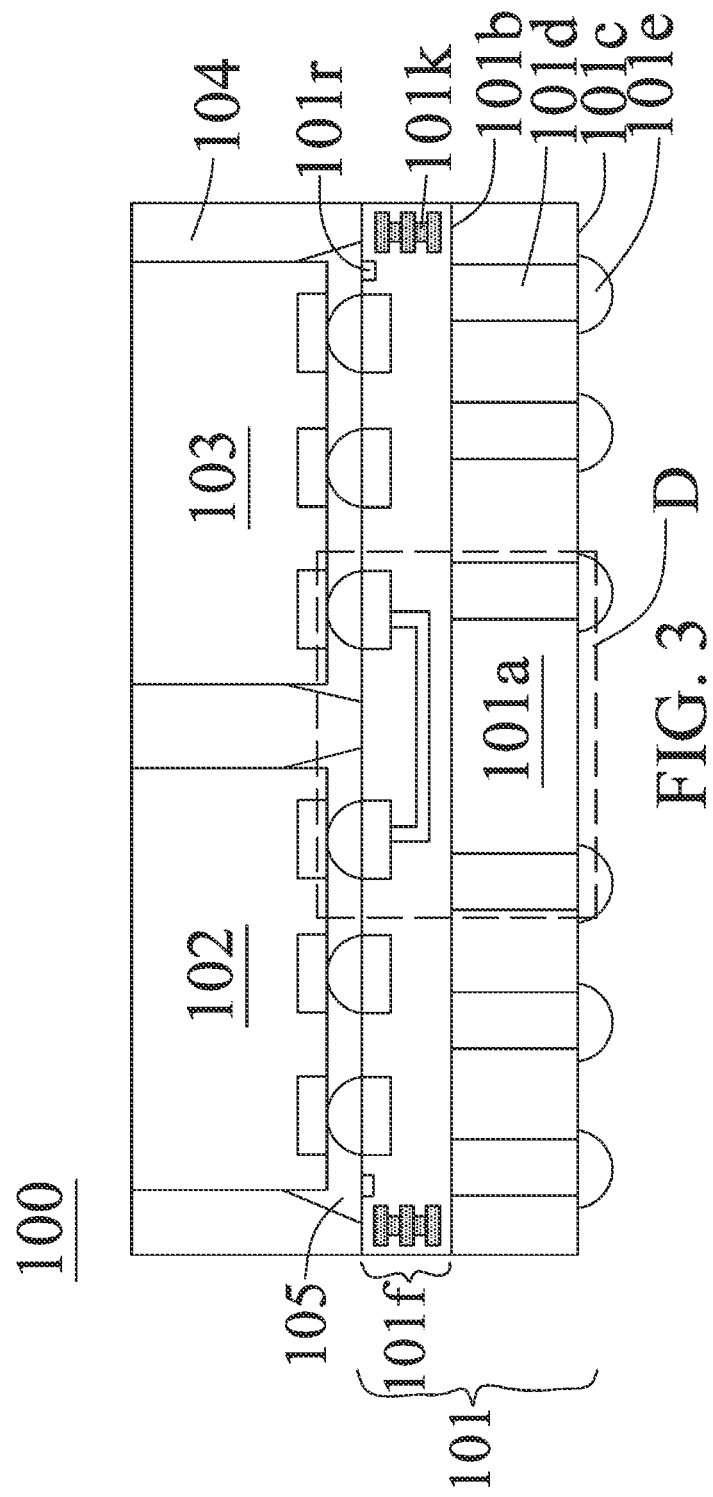
FIG. 3 is a cross-sectional view of the first semiconductor structure of FIG. 1 along a line BB.
Figure 4:
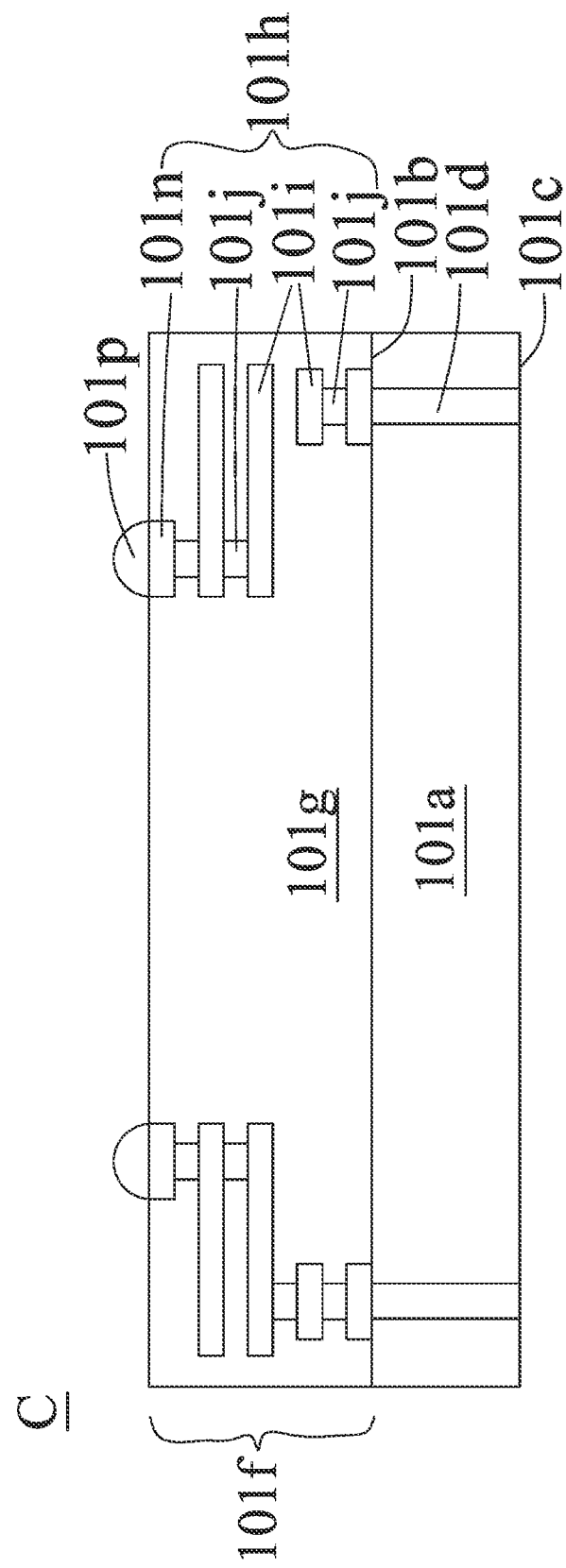
FIG. 4 is an enlarged view of a portion C of the first semiconductor structure in FIG. 2.
Figure 5:
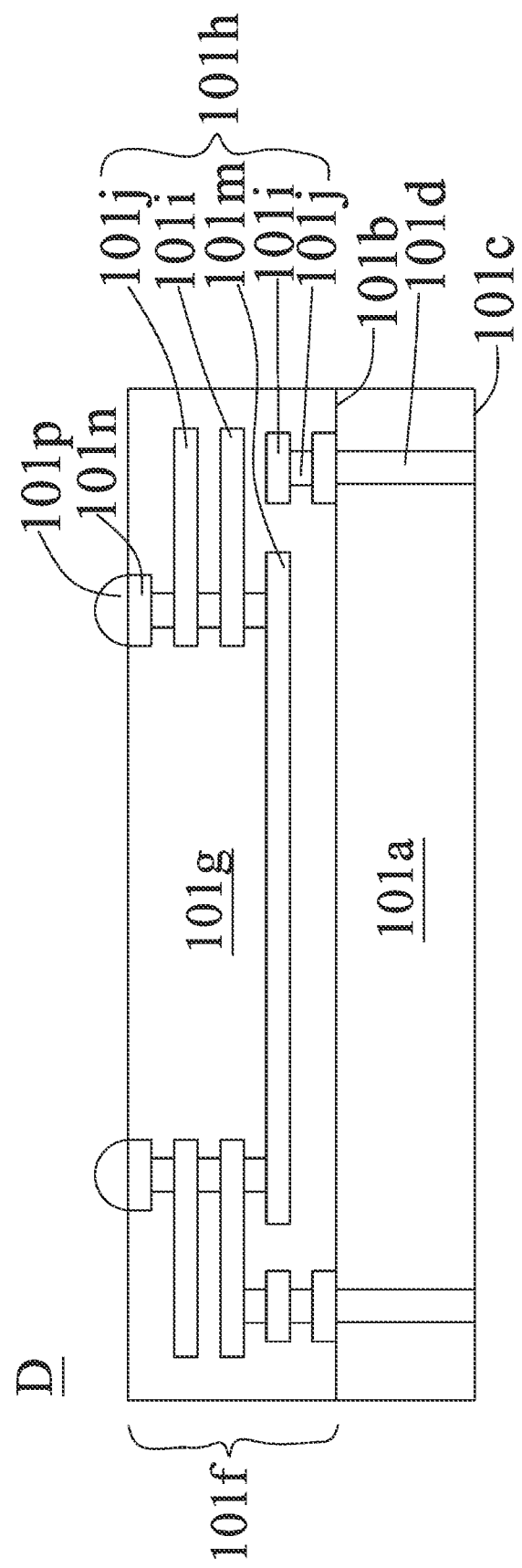
FIG. 5 is an enlarged view of a portion D of the first semiconductor structure in FIG. 3.

FIG. 1 is a schematic cross-sectional top view of a first semiconductor structure 100 in accordance with some embodiments of the present disclosure. FIG. 2 is a schematic cross-sectional view of the first semiconductor structure 100 along a line AA in FIG. 1. FIG. 3 is a schematic cross-sectional view of the first semiconductor structure 100 along a line BB in FIG. 1. FIG. 4 is an enlarged view of a portion C of the first semiconductor structure 100 in FIG. 2. FIG. 5 is an enlarged view of a portion D of the first semiconductor structure 100 in FIG. 3.

In some embodiments, the first semiconductor structure 100 is a chip, a package or a part of the chip or the package. In some embodiments, the first semiconductor structure 100 includes an interposer 101, a first die 102, a second die 103, and a molding 104. For simplicity, only two dies 102 and 103 are discussed below, however, it would be understood that the first semiconductor structure 100 may include one or more dies.

The interposer 101 is configured as an intermediate substrate to electrically connect several dies disposed thereon. In some embodiments, the interposer 101 is an active interposer; that is, a control circuit area is defined over the interposer 101, a control circuit is present over the interposer 101, or a controller is included in the interposer 101.

The first die 102 and the second die 103 are bonded over the interposer 101. In some embodiments, the first die 102 and the second die 103 are a die, a chip or a package. In some embodiments, the first die 102 and the second die 103 are a logic die, application specific integrated circuit (ASIC) die, memory die (e.g. high bandwidth memory (HBM) die), photonics die, system on chip (SoC), a central processing unit (CPU) die, or the like. In some embodiments, the first die 102 is functionally same as, similar to or different from the second die 103.

The molding 104 is disposed over the interposer 101 and surrounds the first die 102 and the second die 103. In some embodiments, the molding 104 covers the entire first die 102 and the second die 103. The molding 104 is in contact with the interposer 101. The molding 104 includes molding material such as molding compound, epoxy, or the like. In some embodiments, the molding 104 is a single layer film or a composite stack.

Referring to FIGS. 2 and 3, the interposer 101 includes a semiconductive substrate 101a and an interconnect layer 101f disposed over the semiconductive substrate 101a. The semiconductive substrate 101a includes semiconductive material such as silicon, germanium, gallium, arsenic, or a combination thereof. In some embodiments, the semiconductive substrate 101a is a part of a semiconductive wafer. In some embodiments, the semiconductive substrate 101a is a silicon substrate.

The semiconductive substrate 101a includes a first surface 101b and a second surface 101c opposite to the first surface 101b. In some embodiments, the first surface 101b is a front side of the interposer 101 and the second surface 101c is a back side of the interposer 101. In some embodiments, the interposer 101 is defined with a first die region at where the first die 102 disposed there over and a second die region at where the second die 103 disposed there over.

In some embodiments, a via 101d is disposed within the semiconductive substrate 101a. The via 101d extends through the semiconductive substrate 101a. In some embodiments, the via 101d extends between the first surface 101b and the second surface 101c of the semiconductive substrate 101a. The via 101d is electrically connected to the interconnect layer 101f. In some embodiments, the via 101d is a through silicon via (TSV). In some embodiments, the via 101d is configured is configured to resist contamination (e.g. moisture) from diffusing into the interposer 101 and minimize crack propagation into the interposer 101. The via 101d includes conductive material such as gold, silver, copper, nickel, tungsten, aluminum, tin, alloys thereof or the like. In some embodiments, a cross section of the via 101d has a circular or polygonal shape. In some embodiments, the via 101d has a cylindrical shape.

In some embodiments, a conductive bump 101e is disposed under the semiconductive substrate 101a and is electrically coupled to the via 101d. In some embodiments, the conductive bump 101e is disposed at the second surface 101c of the semiconductive substrate 101a. The conductive bump 101e is configured to connect the interconnect layer 101f and the via 101d to an external electrical component or interconnection.

The conductive bump 101e includes low-temperature reflowable material. In some embodiments, the conductive bump 101e includes soldering material such as tin, lead, silver, copper, nickel, bismuth, or a combination thereof. In some embodiments, the conductive bump 101e includes conductive material such as gold, silver, copper, nickel, tungsten, aluminum, tin, alloys thereof or the like. In some embodiments, the conductive bump 101e is a ball grid array (BGA) ball, a controlled collapse chip connection (C4) bump, a microbump or the like.

The interconnect layer 101f is disposed over the interposer 101. In some embodiments, the interconnect layer 101f is disposed on the first surface 101b of the semiconductive substrate 101a. FIG. 4 is an enlarged view of the portion C in FIG. 2 and FIG. 5 is an enlarged view of the portion D in FIG. 3, illustrating detailed structure of the interconnect layer 101f. In some embodiments, the interconnect layer 101f includes a dielectric layer 101g and an interconnect structure 101h disposed within the dielectric layer 101g. The dielectric layer 101g is disposed over the semiconductive substrate 101a. In some embodiments, the dielectric layer 101g is disposed on the first surface 101b of the semiconductive substrate 101a. The dielectric layer 101g includes dielectric material such as polymer, polyimide, polybenzoxazole (PBO) or the like.

The interconnect structure 101h is electrical routing within the interposer 101. In some embodiments, the interconnect structure 101h is electrically coupled with the via 101d. The interconnect structure 101h includes conductive material such as copper, silver or the like. In some embodiments, the interconnect structure 101h includes a via portion 101j and a pad portion 101i coupled with the via portion 101j. The via portion 101j extends vertically within the dielectric layer 101g. The pad portion 101i extends laterally within the dielectric layer 101g. In some embodiments, the pad portion 101i is coupled with the via 101d.

In some embodiments, the interconnect structure 101g includes a conductive pad 101n at least partially exposed through the dielectric layer 101g. The conductive pad 101n is electrically connected to the via portion 101j or the pad portion 101i. The conductive pad 101n is configured to receive an external interconnect structure, so that the interconnect structure 101h can electrically connect to the external interconnect structure via the conductive pad 101n. The conductive pad 101n includes conductive material such as copper, silver, aluminum or the like.

In some embodiments, a micro-bump 101p is disposed over the conductive pad 101n. The micro-bump 101p is electrically connected to the interconnect structure 101h. The micro-bump 101p is configured to bond with an external interconnect structure. In some embodiments, the first die 102 and the second die 103 are bonded with the interposer 101 by the micro-bump 101p. In some embodiments, the micro-bump 101p is disposed between the first die 102 and the conductive pad 101n and between the second die 103 and the conductive pad 101n. In some embodiments, an underfill 105 is disposed around the micro-bump 101p, a portion of the first die 102 and a portion of the second die 103. In some embodiments, the micro-bump 101p includes conductive material such as gold, silver, copper, nickel, tungsten, aluminum, tin, alloys thereof or the like. In some embodiments, the micro-bump 101p is a conductive pillar, micro ball, or the like.

In some embodiments, the interconnect structure 101h includes a seal ring member 101k disposed adjacent to and extending along a periphery of the interposer 101. The seal ring member 101k surrounds the interconnect structure 101h. The seal ring member 101k extends vertically within the dielectric layer 101g. The seal ring member 101k is a dummy structure and is electrically isolated from the pad portion 101i, the via portion 101j, and the conductive pad 101n. In some embodiments, the seal ring member 101k is configured to resist damage caused by singulation operation and minimize crack propagation into the interposer 101. In some embodiments, the seal ring member 101k is connected to an electrical ground.

In some embodiments, the interconnect structure 101h includes an interconnect line 101m within the dielectric layer. The interconnect line 101m is electrically coupled to the first die 102 and the second die 103, so that the first die 102 is communicable with the second die 103 through the interconnect line 101m. In some embodiments, the interconnect line 101m extends across the first die region and the second die region. In some embodiments, the interconnect line 101m is proximal to the semiconductive substrate 101a and distal to the conductive pad 101n and the micro-bump 101p.

In some embodiments, the interconnect structure 101g includes a testing pad 101r at least partially exposed through the dielectric layer 101g. In some embodiments, the testing pad 101r is disposed adjacent to the seal ring member 101k and under the first die 102 or the second die 103. The testing pad 101r is electrically connected to interconnect structure 101h. The testing pad 101r is configured to test a circuitry in the interposer 101 by probing or any other suitable testing methods, so that a performance or reliability of the interposer 101 can be ascertained. The testing pad 101r includes conductive material such as copper, silver, aluminum or the like.

Figure 6:
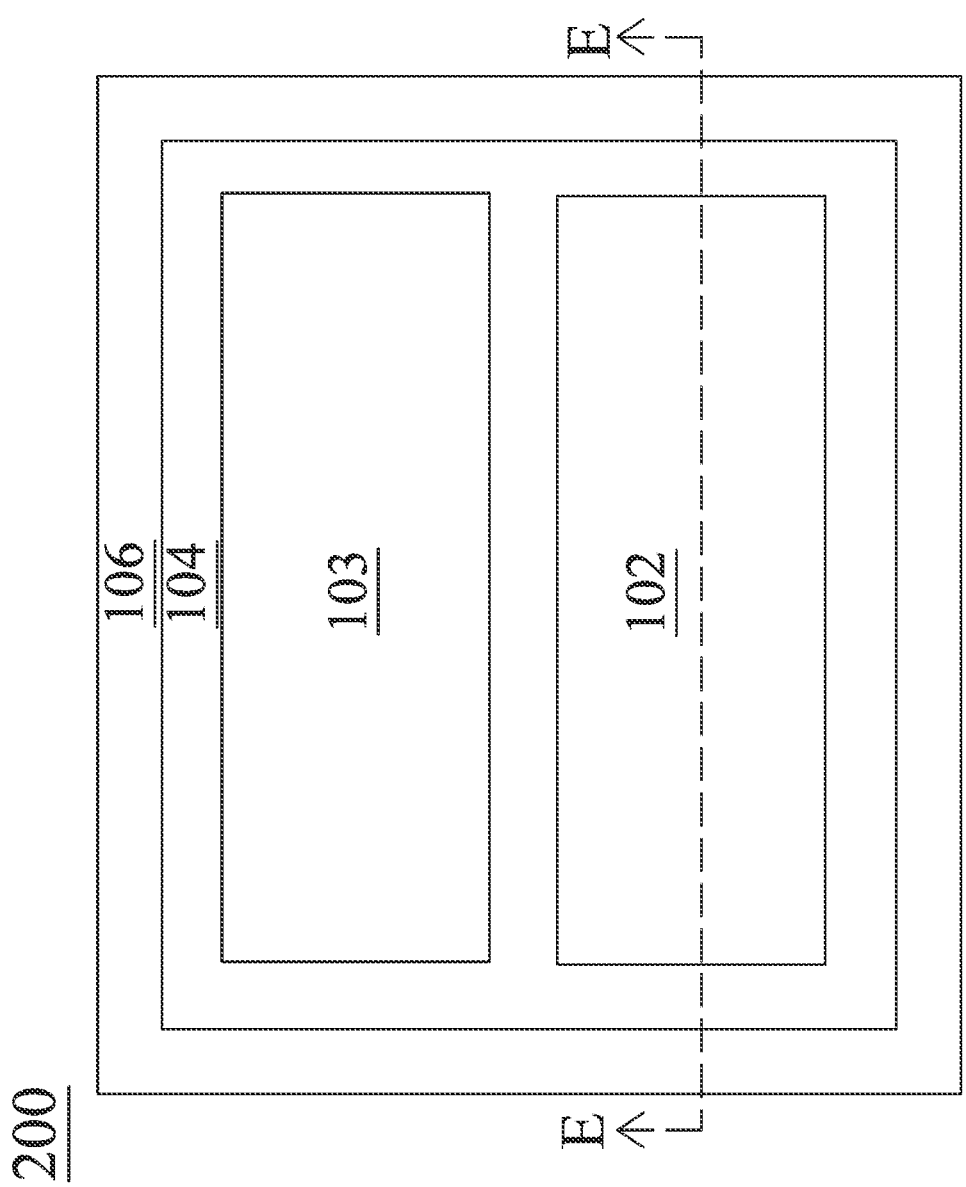
FIG. 6 is a cross-sectional top view of a second semiconductor structure in accordance with some embodiments of the present disclosure.
Figure 7:
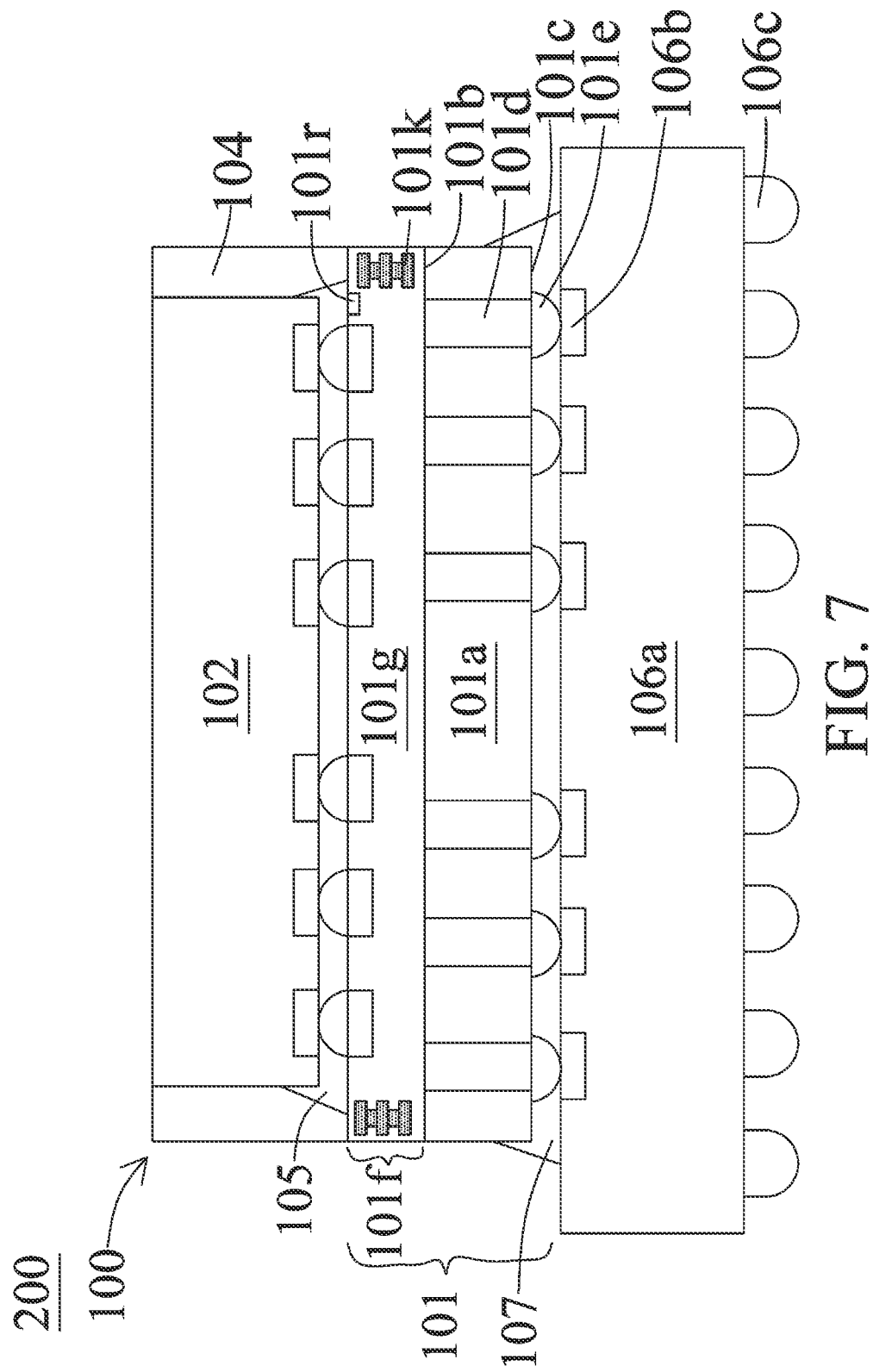
FIG. 7 is a cross-sectional view of the second semiconductor structure of FIG. 6 along a line EE.

FIG. 6 is a schematic cross-sectional top view of a second semiconductor structure 200 in accordance with some embodiments of the present disclosure. FIG. 7 is a schematic cross-sectional view of the second semiconductor structure 200 along a line CC in FIG. 6. The second semiconductor structure 200 is similar to the first semiconductor structure 100, except the second semiconductor structure 200 further includes a packaging substrate 106a, a packaging pad 106b on the packaging substrate 106a, and a packaging bump 106c under the packaging substrate 106a.

In some embodiments, the packaging substrate 106a includes semiconductive material such as silicon, germanium, gallium, arsenic, or a combination thereof. In some embodiments, the packaging substrate 106a includes ceramic, glass or the like. The first semiconductor structure 100 is bonded over the packaging substrate 106a by the packaging pad 106b and the conductive bump 101e. An underfill 107 surrounds the conductive bump 101e and a portion of the interposer 101.

The packaging bump 106c is disposed under the packaging substrate 106a. In some embodiments, the packaging bump 106c is electrically connected to the packaging pad 106b. The packaging bump 106c is configured to connect the packaging substrate 106a to an external electrical component or interconnection. In some embodiments, the packaging bump 106c includes soldering material such as tin, lead, silver, copper, nickel, bismuth, or a combination thereof. In some embodiments, the packaging bump 106c includes conductive material such as gold, silver, copper, nickel, tungsten, aluminum, tin, alloys thereof or the like. In some embodiments, the packaging bump 106c is a ball grid array (BGA) ball, a controlled collapse chip connection (C4) bump, or the like.

In the present disclosure, a method of manufacturing a first semiconductor structure 100 is also disclosed. In some embodiments, the first semiconductor structure 100 is formed by a method 300. The method 300 includes a number of operations and the description and illustration are not deemed as a limitation as the sequence of the operations. FIG. 8 is an embodiment of the method 300 of manufacturing the first semiconductor structure 100. The method 300 includes a number of operations (301, 302 and 303).

Figure 9:
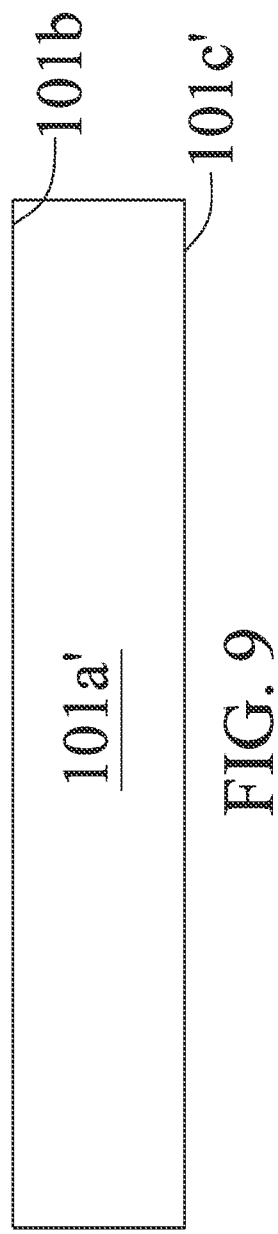
Figure 10:
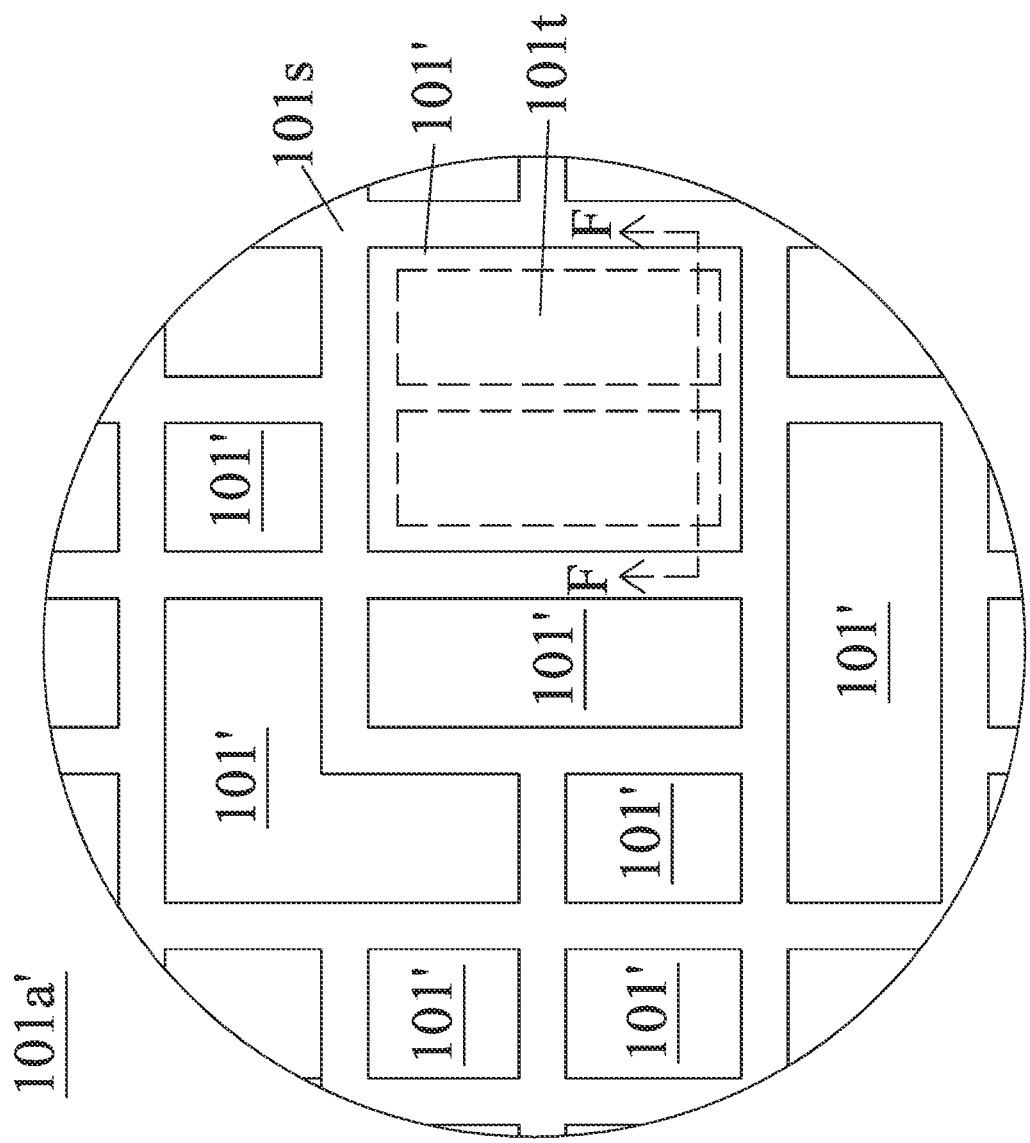

In operation 301, a dielectric layer 101g is disposed over a semiconductive wafer 101a' as shown in FIG. 12. The dielectric layer 101g is disposed by deposition, chemical vapor deposition (CVD) or any other suitable operations. In some embodiments, the semiconductive wafer 101a' is provided as shown in FIGS. 9 and 10, prior to the disposing of the dielectric layer 101g. The semiconductive wafer 101a' includes a first surface 101b and an untreated second surface 101c' opposite to the first surface 101b. In some embodiments, the dielectric layer 101g is disposed over the first surface 101b of the semiconductive wafer 101a' as shown in FIG. 12. The semiconductive wafer 101a' includes semiconductive material such as silicon, germanium, gallium, arsenic, or a combination thereof. In some embodiments, the semiconductive wafer 101a' is a silicon wafer.

FIG. 9 is a schematic cross-sectional view of the semiconductive wafer 101a', and FIG. 10 is a schematic cross-sectional top view of the semiconductive wafer 101a'. In some embodiments, the semiconductive wafer 101a' is defined with several active regions 101' and a scribe line region 101s surrounding each of the active regions 101'. In some embodiments, the active regions 101' have different shapes. In some embodiments, each of the active regions 101' has quadrilateral shape, polygonal shape, L shape, T shape or the like. In some embodiments, each of the active regions 101' have different sizes. In some embodiments, each active region 101' is defined with at least one die region 101t. The scribe line region 101s is configured for subsequent singulation operation, that is, each of the active regions 101' is singulated by sawing along the scribe line region 101s.

In some embodiments, prior to the disposing of the dielectric layer 101g, several vias 101d are formed within the semiconductive wafer 101a' as shown in FIG. 11. Each of the vias 101d extends at least partially through the semiconductive wafer 101a'. The vias 101d are formed by removing some portions of the semiconductive wafer 101a to form several recesses, and then disposing conductive materials into the recesses. In some embodiments, the vias 101d are through silicon vias (TSVs).

Figure 13:
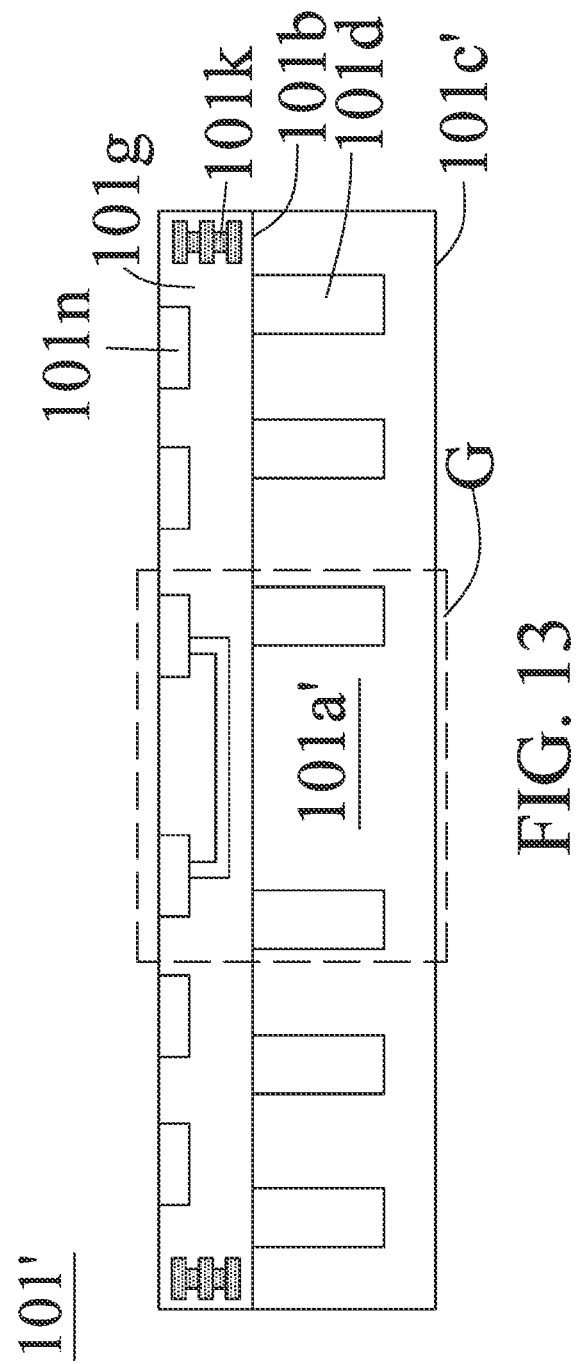
Figure 14:
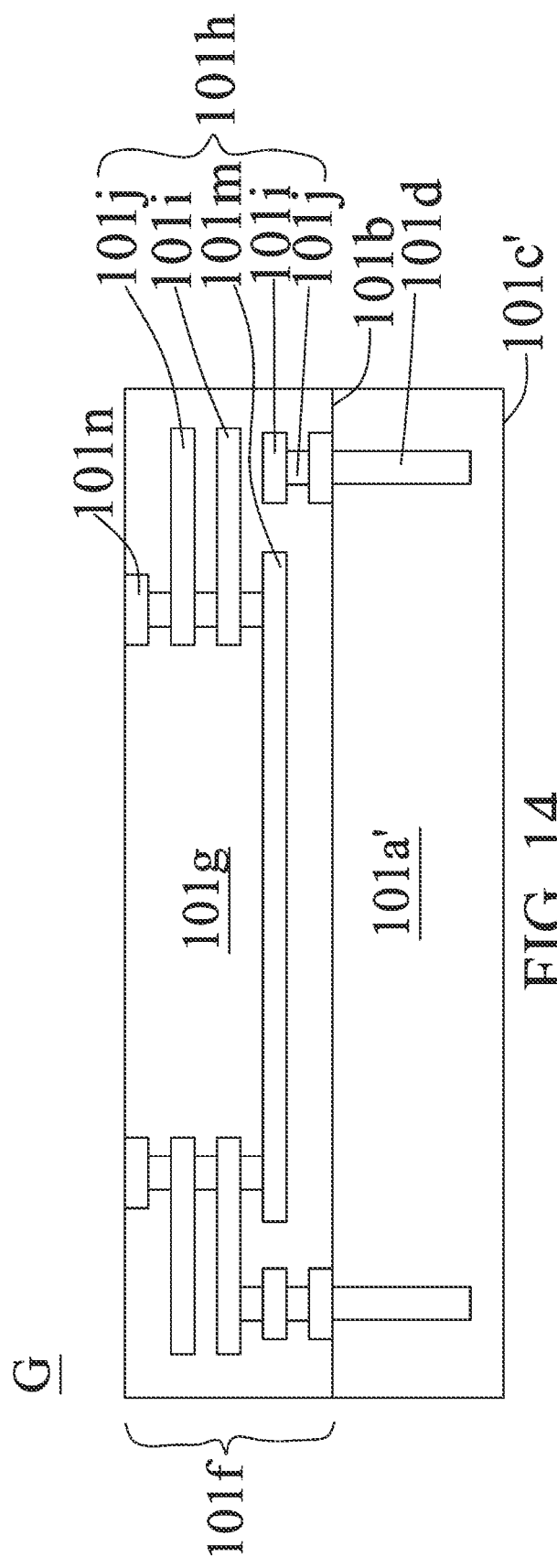

In operation 302, several interconnect structures 101h are formed within the dielectric layer 101g as shown in FIGS. 13 and 14. FIG. 13 is a schematic cross-sectional view of one of the active region 101' along a line FF in FIG. 10. FIG. 14 is an enlarged view of the portion G in FIG. 13, illustrating detailed structure of the interconnect structures 101h. In some embodiments, the interconnect structure 101h is formed by removing some portions of the dielectric layer 101g to form several recesses, and then disposing conductive materials into the recesses. The portions of the dielectric layer 101g are removed by photolithography, etching or any other suitable operations. The conductive material is disposed by electroplating, sputtering or any other suitable operations.

In some embodiments, the formation of the interconnect structures 101h includes forming an interconnect line 101m within the dielectric layer 101g and across at least two die regions 101t. In some embodiments, the formation of the interconnect structures 101h includes forming a seal ring member 101k adjacent to the scribe line region 101s and within one of the active regions 101'. In some embodiments, the formation of the interconnect structures 101h includes forming a conductive pad 101n at least partially exposed through the dielectric layer 101g. In some embodiments, the seal ring member 101k surrounds the die region 101t. In some embodiments, the formation of the interconnect line 101m is prior to the formation of the seal ring member 101k and the formation of the conductive pad 101n. In some embodiments, the interconnect line 101m, the seal ring member 101k and the conductive pad 101n have similar configurations as those illustrated in FIG. 5 and discussed above.

Figure 15:
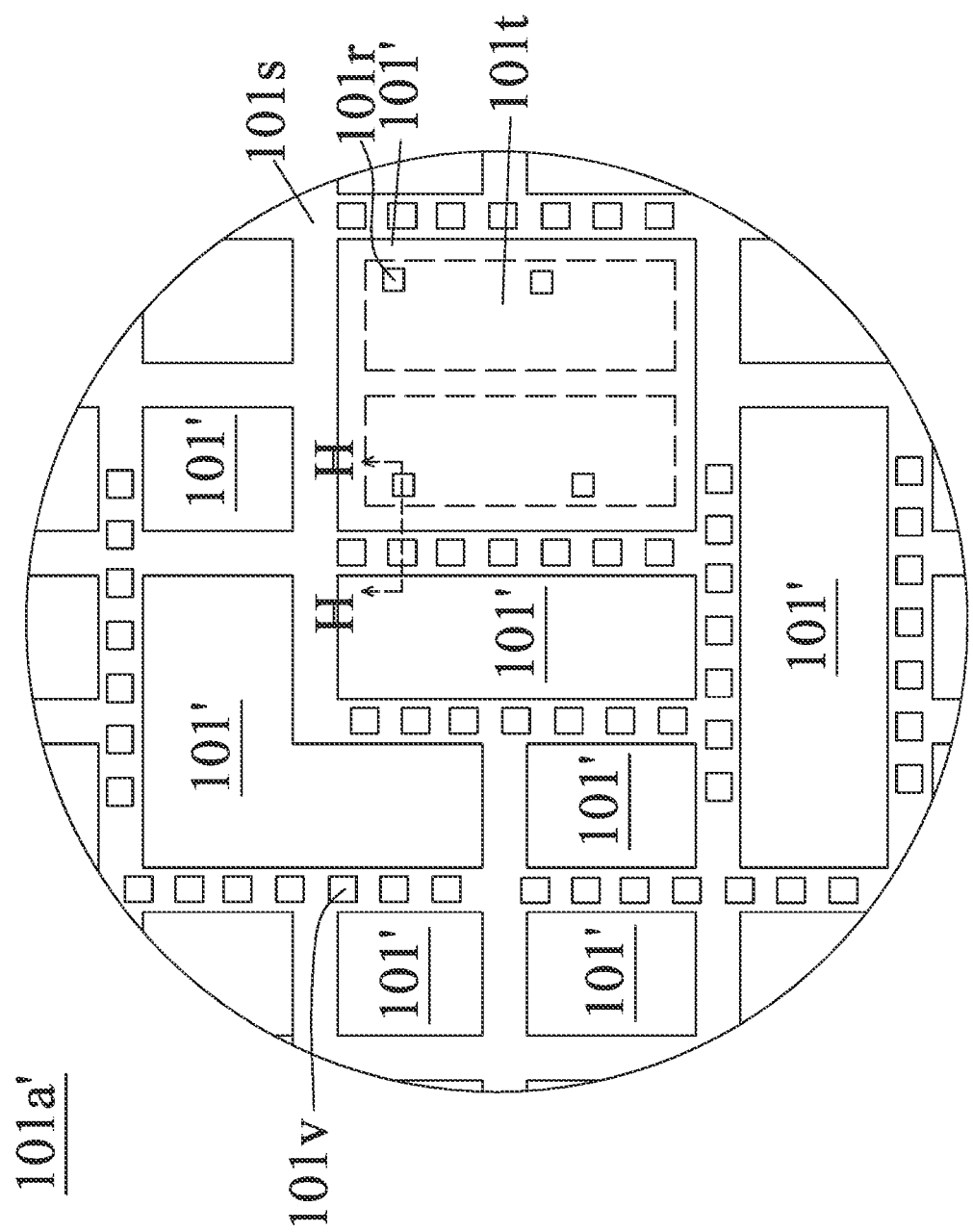
Figure 16:
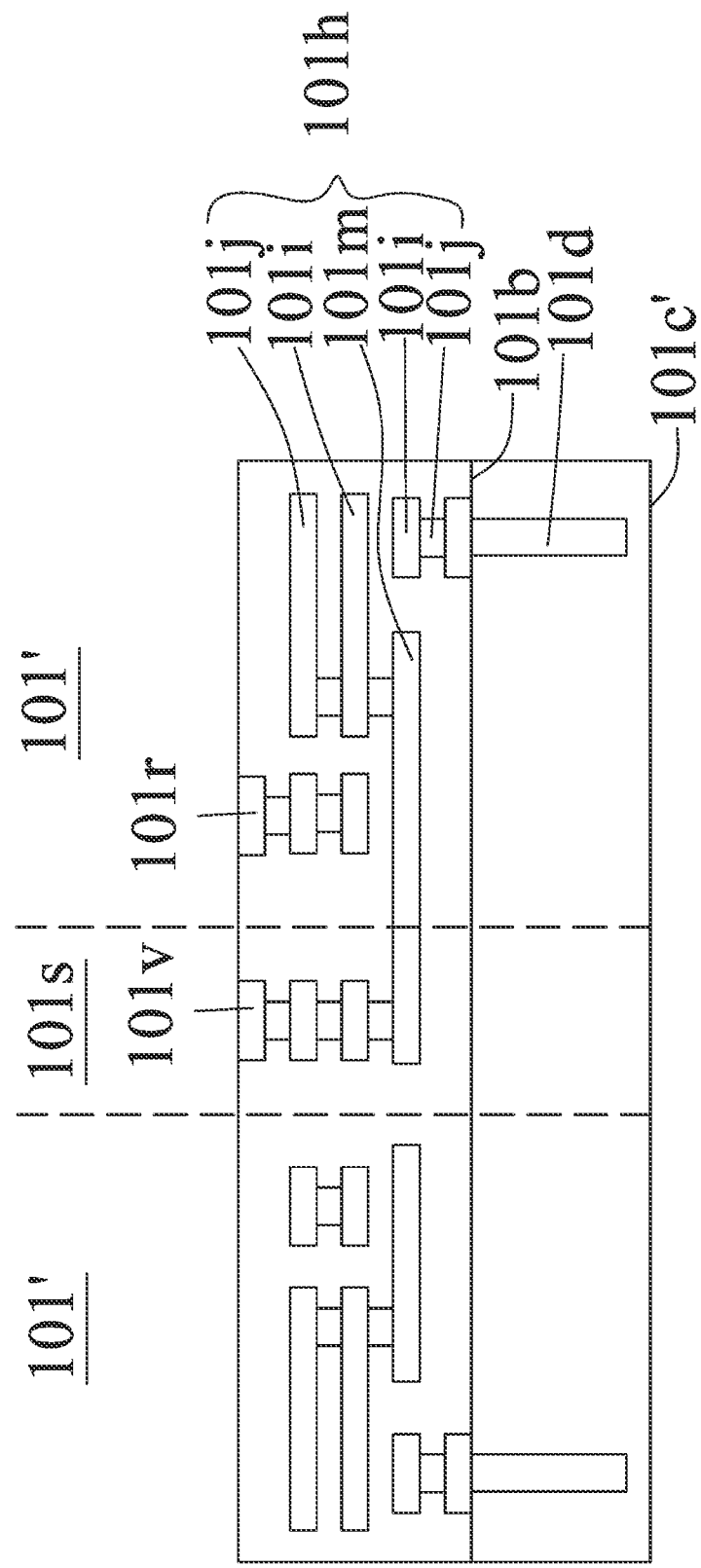

In some embodiments, the formation of the interconnect structures 101h includes forming several first testing pads 101v within the scribe line region 101s and at least partially exposed through the dielectric layer 101g, as shown in FIGS. 15 and 16. FIG. 15 is a schematic cross-sectional top view of the semiconductive wafer 101a', and FIG. 16 is an enlarged cross-sectional view along a line HH in FIG. 15, illustrating detailed structure of the interconnect structures 101h. The first testing pad 101v is disposed between two of the active regions 101'. The first testing pad 101v is electrically connected to the interconnect structure 101h. The first testing pad 101v is configured to test a circuitry in the active region 101'by subsequent probing or any other suitable testing methods. The first testing pad 101v includes conductive material such as copper, silver, aluminum or the like.

In some embodiments, the formation of the interconnect structures 101h includes forming several second testing pads 101r within the active regions 101' and at least partially exposed through the dielectric layer 101g, as shown in FIGS. 15 and 16. The second testing pad 101r is electrically connected to the interconnect structure 101h. The second testing pad 101r is configured to test a circuitry in the active region 101'by subsequent probing or any other suitable testing methods. The second testing pad 101r includes conductive material such as copper, silver, aluminum or the like.

In some embodiments, the first testing pads 101v and the second testing pads 101r are formed simultaneously. In some embodiments, a total number of the first testing pads 101v is substantially greater than a total number of the second testing pads 101r. In some embodiments, the first testing pads 101v and the second testing pads 101r are probed by a testing probe to test a circuitry in the active region 101' after the formation of the first testing pads 101v and the second testing pads 101r. In some embodiments, the seal ring member 101k extends between the first testing pad 101v and the second testing pad 101r.

Figure 17:
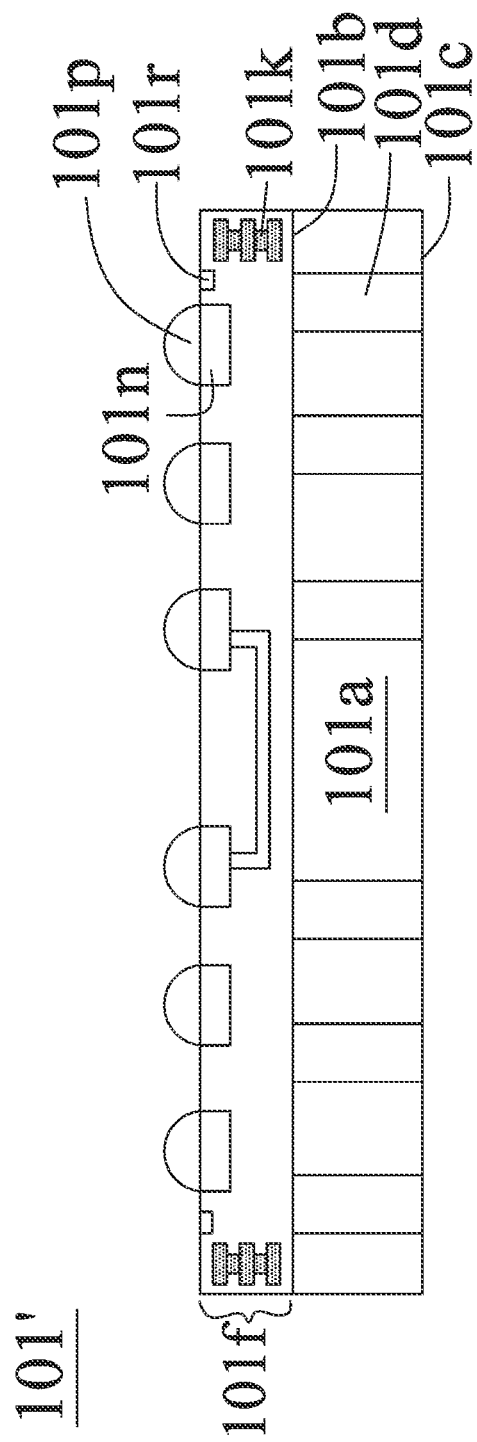

In operation 303, the semiconductive wafer 101a' is sawn along the scribe line region 101s to form several interposers 101'. FIG. 17 shows one of the interposers 101' after the sawing of the semiconductive wafer 101a'. In some embodiments, the probing of the first testing pads 101v and the second testing pad 101r is implemented prior to the sawing of the semiconductive wafer 101a'. In some embodiments, several micro-bumps 101p are formed on the conductive pad 101n before the sawing of the semiconductive wafer 101a'. In some embodiments, some portions of the semiconductive wafer 101a' are removed prior to the sawing of the semiconductive wafer 101a', thereby the via 101d extends through the semiconductive wafer 101a'. The removal includes reducing a height of the semiconductive wafer 101a' to form a second surface 101c.

After the formation of the micro-bumps 101p, the interposers 101' are singulated from the semiconductive wafer 101a' by sawing along the scribe line region 101s. Each of the first testing pads 101v is at least partially removed by the sawing of the semiconductive wafer 101a'. In some embodiments, all of the first testing pads 101v are removed by the sawing. In some embodiments, all of the first testing pads 101v are damaged by the sawing. The second testing pads 101v would not be removed by the sawing.

The interposers 101 are formed after the sawing. In some embodiments, the interposers 101 have different shapes from each other. For example, one of the interposers 101 has a quadrilateral shape, and another one of the interposers 101 has a L shape. In some embodiments, the interposers 101 have different top cross-sectional areas from each other. In some embodiments, a top cross-sectional area of one of the interposers 101 is substantially greater than a top cross-sectional area of another one of the interposers 101. In some embodiments, the seal ring member 101k extends along a periphery of the interposer 101.

In some embodiments, fragments or residuals of the first testing pads 101v are present at a sidewall of the interposer 101. In some embodiments, fragments or residuals of the first testing pads 101v are present at a sidewall of the dielectric layer 101g or a sidewall of the semiconductive substrate 101a. The second testing pads 101v would not be removed by the sawing, and thus would be present in the interposer 101.

Figure 18:
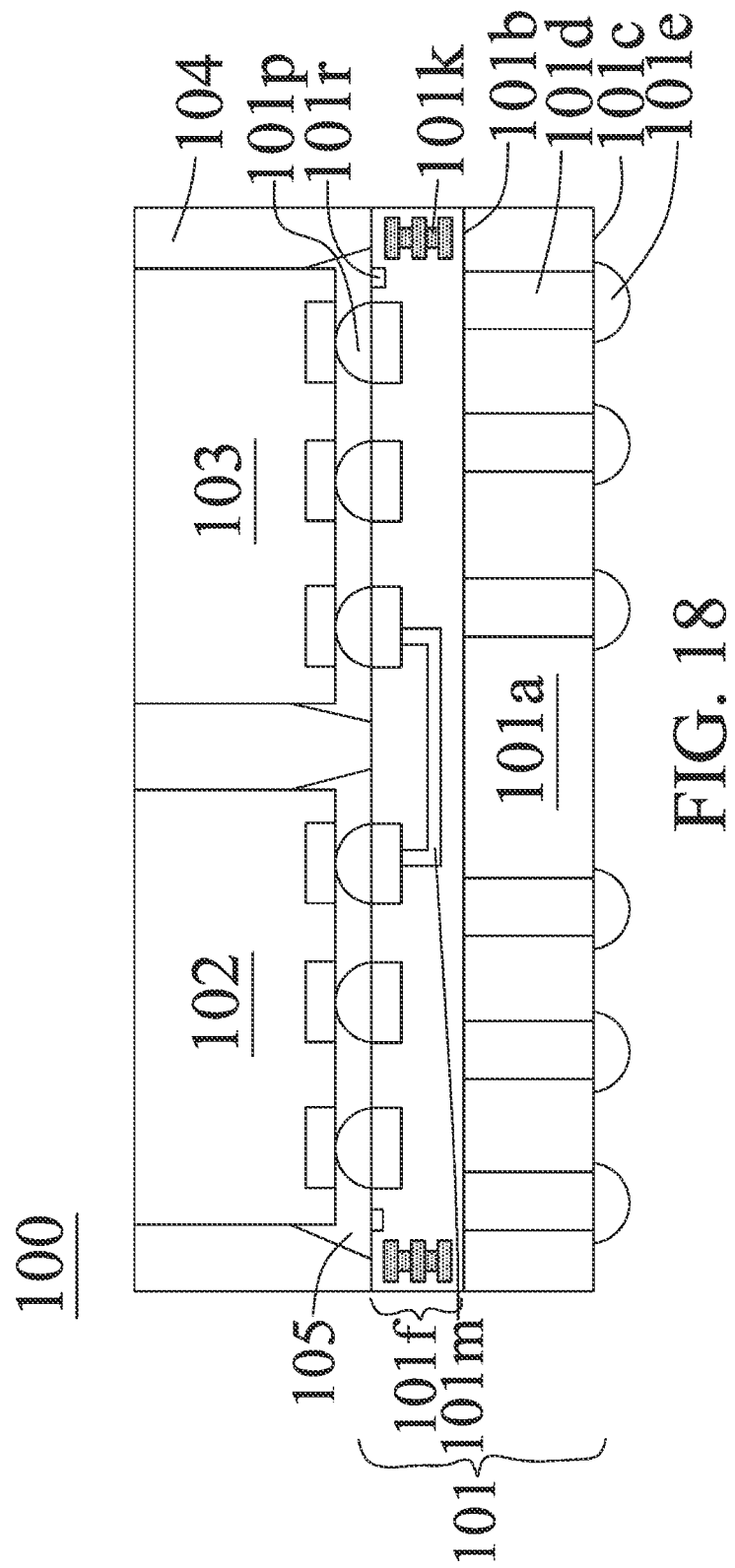

After the formation of the interposer 101 by the sawing, at least one die 102 and/or 103 is bonded over the interposer 101 as shown in FIG. 18. In some embodiments, a first die 102 is bonded over the die region 101*t*, and a second die 103 is bonded over another die region 101*t*. The first die 102 and the second die 103 are bonded with the interposer 101 by the micro-bumps 101*p*. After the bonding of the first die 102 and the second die 103 with the interposer 101, the first die 102 is electrically communicable with the second die 103 through the interconnect line 101*m*.

In some embodiments, a molding 104 is formed around the first die 102 and the second die 103 as shown in FIG. 18. The molding 104 is formed by disposing a molding compound over the interposer 101, the first die 102 and the second die 103, and then planarizing the molding compound to expose a top surface of the first die 102 and a top surface of the second die 103. In some embodiments, a conductive bump 101*e* is formed under the via 101*d* as shown in FIG. 18. The conductive bump 101*e* is formed by solder pasting, ball dropping or any other suitable operations. In some embodiments, a first semiconductor structure 100 is formed as shown in FIG. 18, which is similar to the one illustrated in any of FIGS. 1 to 5.

One aspect of this disclosure relates to a method of manufacturing a semiconductor structure. The method includes disposing a dielectric layer over a semiconductive wafer defined with a plurality of active regions and a scribe line region surrounding each of the plurality of active regions; forming a plurality of interconnect structures within the dielectric layer, wherein the formation of the plurality of interconnect structures includes forming a plurality of first testing pads within the scribe line region and at least partially exposed through the dielectric layer; and sawing the semiconductive wafer along the scribe line region to form a first interposer and a second interposer, wherein each of the plurality of first testing pads is at least partially removed by the sawing of the semiconductive wafer.

In some embodiments, a top cross-sectional area of the first interposer is substantially greater than a top cross-sectional area of the second interposer. In some embodiments, a top cross-sectional area of the first interposer and a top cross-sectional area of the second interposer are in different shapes. In some embodiments, the method further includes probing the plurality of first testing pads by a testing probe prior to the sawing of the semiconductive wafer.

In some embodiments, the formation of the plurality of interconnect structures includes forming a plurality of second testing pads within at least one of the plurality of active regions and at least partially exposed through the dielectric layer. In some embodiments, a number of the plurality of first testing pads is substantially greater than a number of the plurality of second testing pads. In some embodiments, the plurality of first testing pads and the plurality of second testing pads are formed simultaneously.

In some embodiments, the plurality of second testing pads are formed prior to the sawing of the semiconductive wafer. In some embodiments, further comprising probing the plurality of second testing pads by a testing probe prior to the sawing of the semiconductive wafer. In some embodiments, the formation of the plurality of interconnect structures includes forming a seal ring member adjacent to the scribe line region and within one of the plurality of active regions. In some embodiments, the seal ring member extends along a periphery of the first interposer or a periphery of the second interposer.

One aspect of this disclosure relates to a method of manufacturing a semiconductor structure. The method includes forming a via extending partially through a semiconductive wafer defined with an active region and a scribe line region surrounding the active region; disposing a dielectric layer over the semiconductor wafer; forming an interconnect structure within the dielectric layer, wherein the formation of the interconnect structure includes forming a first testing pad within the scribe line region and at least partially exposed through the dielectric layer; and sawing the semiconductor wafer along the scribe line region to form an interposer, wherein the first testing pad is at least partially removed by the sawing of the semiconductive wafer.

In some embodiments, the active region includes a first die region and a second die region, a first die is bonded over the first die region, and a second die is bonded over the second die region. In some embodiments, the formation of the interconnect structure includes forming an interconnect line within the dielectric layer and across the first die region and the second die region. In some embodiments, the first die is electrically communicable with the second die through the interconnect line.

In some embodiments, the formation of the interconnect structure includes: forming a second testing pad at least partially exposed through the dielectric layer and within the first die region or the second die region; forming a seal ring member surrounding the first die region and the second die region and extending between the first testing pad and the second testing pad. In some embodiments, the method further includes removing portions of the semiconductive wafer prior to the sawing of the semiconductive wafer, thereby the via extends through the semiconductive wafer.

An aspect of this disclosure relates to a semiconductor structure. The semiconductor structure includes an interposer including a semiconductive substrate, a dielectric layer over the semiconductive substrate, and an interconnect structure within the dielectric layer; a first die and a second die bonded over the interposer; a molding disposed over the interposer and surrounding the first die and the second die, wherein an interconnect structure includes an interconnect line electrically connecting the first die to the second die, a seal ring member extending along a periphery of the interposer, and a first testing pad disposed adjacent to the seal ring member and under the first die or the second die.

In some embodiments, a residual of a second testing pad is disposed at a sidewall of the dielectric layer and uncovered by the first die and the second die. In some embodiments, the semiconductor structure further includes a packaging substrate disposed under the interposer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, comprising:

disposing a dielectric layer over a semiconductive wafer defined with a plurality of active regions and a scribe line region surrounding each of the plurality of active regions;

forming a plurality of interconnect structures within the dielectric layer, wherein the formation of the plurality of interconnect structures includes forming a plurality of first testing pads within the scribe line region and at least partially exposed through the dielectric layer; and sawing the semiconductive wafer and the dielectric layer along the scribe line region to form a first interposer and a second interposer entirely separated from the first interposer and to at least partially remove one of the plurality of first testing pads.

2. The method of claim 1, wherein a top cross-sectional area of the first interposer is substantially greater than a top cross-sectional area of the second interposer.

3. The method of claim 1, wherein a top cross-sectional area of the first interposer and a top cross-sectional area of the second interposer are in different shapes.

4. The method of claim 1, further comprising probing the plurality of first testing pads by a testing probe prior to the sawing of the semiconductive wafer.

5. The method of claim 1, wherein the formation of the plurality of interconnect structures includes forming a plurality of second testing pads within at least one of the plurality of active regions and at least partially exposed through the dielectric layer.

6. The method of claim 5, wherein a number of the plurality of first testing pads is substantially greater than a number of the plurality of second testing pads.

7. The method of claim 5, wherein the plurality of first testing pads and the plurality of second testing pads are formed simultaneously.

8. The method of claim 5, wherein the plurality of second testing pads are formed prior to the sawing of the semiconductive wafer.

9. The method of claim 5, further comprising probing the plurality of second testing pads by a testing probe prior to the sawing of the semiconductive wafer.

10. The method of claim 1, wherein the formation of the plurality of interconnect structures includes forming a seal ring member adjacent to the scribe line region and within one of the plurality of active regions.

11. The method of claim 10, wherein the seal ring member extends along a periphery of the first interposer or a periphery of the second interposer.

12. A method of manufacturing a semiconductor structure, comprising:

forming a via extending partially through a semiconductive wafer defined with an active region and a scribe line region surrounding the active region;

disposing a dielectric layer over the semiconductor wafer;

forming an interconnect structure within the dielectric layer, wherein the formation of the interconnect structure includes forming a first testing pad within the scribe line region and at least partially exposed through the dielectric layer; and sawing the semiconductor wafer and the dielectric layer along the scribe line region to form an interposer; and forming a conductive bump over the via, wherein the sawing of the semiconductor wafer and the dielectric layer at least partially removes the first testing pad to form a residual of the first testing pad at a sidewall of the interposer, and the residual of the first testing pad is exposed through the interposer during and after the formation of the conductive bump.

13. The method of claim 12, wherein the active region includes a first die region and a second die region, a first die is bonded over the first die region, and a second die is bonded over the second die region.

14. The method of claim 13, wherein the formation of the interconnect structure includes forming an interconnect line within the dielectric layer and across the first die region and the second die region.

15. The method of claim 13, wherein the first die is electrically communicable with the second die through the interconnect line.

16. The method of claim 13, wherein the formation of the interconnect structure includes:

forming a second testing pad at least partially exposed through the dielectric layer and within the first die region or the second die region;

forming a seal ring member surrounding the first die region and the second die region and extending between the first testing pad and the second testing pad.

17. The method of claim 13, further comprising removing portions of the semiconductive wafer prior to the sawing of the semiconductive wafer, thereby the via extends through the semiconductive wafer.

18. A semiconductor structure, comprising:

an interposer including a semiconductive substrate, a via extending through the semiconductive substrate, a conductive bump disposed over the via, a dielectric layer over the semiconductive substrate, and an interconnect structure within the dielectric layer;

a first die and a second die bonded over the interposer;

a molding disposed over the interposer and surrounding the first die and the second die, wherein the interconnect structure includes an interconnect line electrically connecting the first die to the second die, a seal ring member extending along a periphery of the interposer, a first testing pad disposed adjacent to the seal ring member and under the first die or the second die, and a residual of a second testing pad disposed at a sidewall of the dielectric layer and exposed through the interposer.

19. The semiconductor structure of claim 18, wherein the seal ring member is between the first testing pad and the residual of the second testing pad.

20. The semiconductor structure of claim 18, further comprising a packaging substrate disposed under the interposer.

* * * * *